United States Patent [19]

Lee

[11] Patent Number: 4,820,654
[45] Date of Patent: Apr. 11, 1989

[54] ISOLATION OF REGIONS IN A CMOS STRUCTURE USING SELECTIVE EPITAXIAL GROWTH

[75] Inventor: Steven S. Lee, Colorado Springs, Colo.

[73] Assignee: NCR Corporation, Dayton, Ohio

[21] Appl. No.: 130,481

[22] Filed: Dec. 9, 1987

[51] Int. Cl.[4] .................. H01L 21/316; H01L 21/318; H01L 21/32
[52] U.S. Cl. ...................................... 437/067; 437/090
[58] Field of Search ............................... 437/90, 91, 67

[56] References Cited

FOREIGN PATENT DOCUMENTS 0214512 3/1987 European Pat. Off. .............. 437/61
0232440 12/1984 Japan ..................... 437/72

*Primary Examiner*—Olik Chaudhuri
*Attorney, Agent, or Firm*—Wilbert Hawk, Jr.; Casimer K. Salys

[57] ABSTRACT

A process for forming trench-like isolation structures situated in a semiconductor substrate between adjacent regions of substrate and epitaxial silicon. The trench-like structures include a relatively thick high dielectric constant material enclosed by a relatively thinner pad/buffer dielectric layer. The fabrication of the trench-like isolation regions commences with the formation of recesses with substantially vertical sidewalls into the silicon substrate, the conformal deposition of the relatively thin pad dielectric, and the conformal deposition of a relatively thicker high dielectric constant material. Anisotropic etching is then applied to retain the two dielectric layers along the vertically disposed walls of the recesses. A second conformal deposition of thin pad dielectric, followed by anisotropic etch to expose the substrate at the bottoms of the recesses, results in a sidewall structure with a high dielectric constant material enclosed within pad dielectric material. Selective epitaxial growth of semiconductor from the exposed substrate at the bottoms of the recesses is continued until the recess is substantially full. A planarization of the concluding structure produces trench-like dielectric filled regions of relatively narrow dimension and potentially deep penetration between adjacent substrate and epitaxial semiconductor regions.

12 Claims, 2 Drawing Sheets

ISOLATION OF REGIONS IN A CMOS STRUCTURE USING SELECTIVE EPITAXIAL GROWTH

BACKGROUND OF THE INVENTION

The present invention relates to the fabrication of semiconductor integrated circuit devices, and more particularly to an efficient method for forming trench-like structures which isolate adjacent p-type and n-type regions of a CMOS integrated circuit. The invention is differentiated by its use of selective epitaxial growth (SEG) with nucleation site control and stress relief.

Conventional integrated circuit semiconductor fabrication practices separate CMOS active regions in a semiconductor substrate with field oxide regions grown from the substrate silicon. Numerous refinements have been proposed and implemented to minimize the deleterious effect of the phenomenon commonly referred to as bird's beak encroachment. Most recently, anisotropic etching and refill technique have been the subject of numerous studies and publications as substitutes for grown field oxide given the present availability of highly directional etching equipment. Unfortunately, the refill by deposition operations have proven to be more intractable than originally anticipated.

It is known that adjacent but differently doped monocrystalline regions can be formed by a selective epitaxial growth/deposition. For example, the article entitled "Selective Epitaxy for CMOS VLSI" by Sabine et al., which appeared in the January 1985 issue of the *IEEE Electron Device Letters*, describes a selective eptaxial growth (SEG) technique to refill well regions etched in a layer of silicon dioxide which was formed over a substrate. U.S. Pat. No. 4,473,598 describes the filling of trenches with polysilicon or combinations of polycrystalline and epitaxial silicon by selective growth. Other refinements of SEG are described in the article entitled "Advanced Dielectric Isolation Through Selective Epitaxial Growth Techniques" by Borland et al., which appeared in the August 1985 issue of *Solid State Technology*. The latter article compares and contrasts the various other dielectric isolation technologies in the course of evaluating an SEG technique. Refinements of the SEG concept are further described in the article entitled, "Novel Device Isolation Technology With Selective Epitaxial Growth" by Endo et al., which appeared in the September 1984 issue of the *IEEE Transactions On Electron Devices*. According to that teaching, the sidewalls of the openings in the oxide layer are coated with a silicon nitride prior to SEG. Other applications of sidewall nitrides with pad/buffer oxides and an anisotropic etching of the silicon substrate are described in the context of an otherwise significantly different process in U.S. Pat. No. 4,604,162.

A very recent publication which bears upon the topic of the present invention is entitled "¼-um CMOS Isolation Technique Using Selective Epitaxy" by Kasai et al., which appeared in the June 1987 issue of the *IEEE Transactions on the Electron Devices*. The Kasai et al. technique involves the use of SEG to fill wells formed in substrate recesses, and includes an isolation structure which is trench-like and composed of a very thin nitride layer combined with a relatively thick oxide layer. The formation of undesirable voids in the final isolation structure is an acknowledged defect.

SUMMARY OF THE INVENTION

According to a preferred practice of the present invention, narrow and dielectric filled trench-like structures are formed in a substrate between regions of monocrystalline substrate silicon and monocrystalline epitaxial silicon. Fabrication begins with the formation of trench-like recesses, having substantially vertical sidewalls, in the substrate by anisotropic etch of the substrate silicon and an overlying oxide layer in the presence of a photoresist mask. Following the formation of a relatively thin pad/buffer layer of silicon dioxide over the exposed silicon substrate, silicon nitride is conformally deposited and in direct succession anisotropically etched to retain moderate thicknesses of the silicon nitride on the sidewalls of the recesses, while exposing the oxide cap over the nonrecessed regions of the substrate and the pad oxide or substrate itself in the centrally disposed regions of the recess bottoms.

A second relatively thin pad/buffer oxide layer is then formed over the resident nitride layer and followed by an anisotropic etch operation suitable to remove residual pad/buffer oxide from horizontally disposed surfaces. The etch specifically removes pad/buffer oxide from the centrally disposed regions of the recess bottoms to expose the monocrystalline substrate.

Upon the conclusion of such a deposition and etching operations, the sidewalls of the recesses are masked by compound structures composed of a relatively thin pad/buffer oxide layer, a relatively thick nitride layer, and a second relatively thin pad/buffer oxide layer. This combination substantially isolates the nitride layer from the monocrystalline silicon substrate and subsequently formed epitaxial silicon regions.

The process next involves a selective epitaxial growth (SEG) of crystalline silicon in the recess regions between the composite sidewall dielectric layers. The substrate silicon, at the bottom of each recess, provides the nucleation sites for the epitaxial growth of silicon, which epitaxial growth is continued under conditions which facilitate SEG until the epitaxial region reaches the level of the capped and non-recessed substrate. The epitaxial silicon may be selectively doped both as to impurity type and concentration.

Fabrication is concluded with a planarizing etch to provide a concluding planar surface at the level of the non-recessed regions of the original monocrystalline silicon substrate. Thereafter, p-channel and n-channel field effect transistors, or bipolar transistors of opposite types, are selectively formed in the immediately adjacent but dielectrically separated regions of monocrystalline and epitaxial silicon.

In contrast to the conventional practice of the prior art, the present process is implemented using a single photolithographic masking operation, provides for the formation of p-type and n-type regions with selected impurity characteristics, completely eliminates the the bird's beak problem, incorporates a pad/buffer oxide between all crystalline silicon and silicon nitride boundaries, utilizes lower nucleation site oxides for greater selectivity during the epitaxial growth, forms the trench-like structures from relatively high dielectric constant insulators, and employs a dielectric configuration which prevents undesired undercutting during the accentuated cleaning operation attendant the preparation of the substrate silicon for epitaxial growth. These and other features will be more clearly appreciated and understood upon considering the detailed embodiment which follows.

DESCRIPTION OF THE PREFERRED EMBODIMENT

The concepts which are central to the present invention are preferably practiced in the fabrication of integrated circuit field effect transistors of the class generally known as CMOS, wherein both p-channel and n-channel devices reside in a common silicon substrate structure. In contrast to conventional practice, where first impurity type transistors are formed directly into the substrate and the opposite impurity type transistors are formed in well regions in the same substrate structure, and all devices are separated using grown field oxide dielectric regions, the present invention involves the formation of trench-like isolation structures between substrate silicon regions and oppositely doped epitaxial silicon regions, both regions being composed of monocrystalline silicon.

Figure 1:
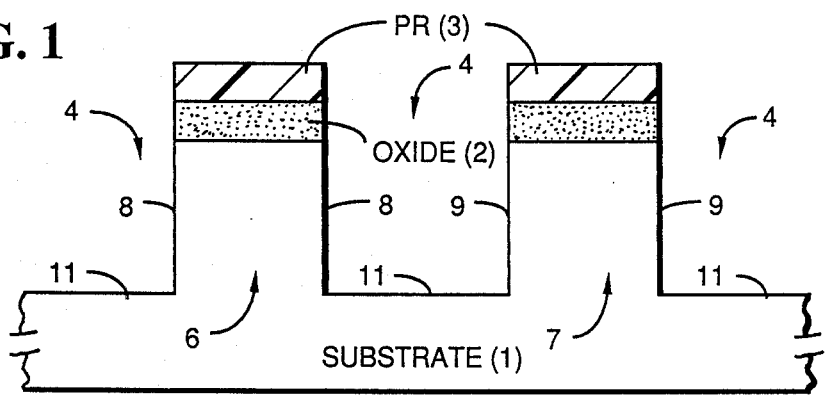
FIGS. 1–4 are schematic cross sections of a semiconductor substrate at incremental stages of forming trench-like isolation structures in a silicon substrate.

FIG. 1 schematically illustrates in the cross section the appearance of a monocrystalline silicon substrate 1 following, in sequence, the formation of 500–1000 nanometers of chemical vapor deposited or thermally grown oxide as layer 2, the formation of a photolithographically patterned photoresist as layer 3, and an anisotropic reactive ion etch in the presence of masking photoresist 3 using, for example, $CHF_3$ with $O_2$ plasma, to form recesses having a depth of 500–4000 nanometers into silicon substrate 1. Oxide 2 services as a cap over pedestal regions 6 and 7 during subsequent process operations. Sidewalls 8 and 9 of corresponding pedestal 6 and 7 are preferably near vertical in orientation, the importance of the orientation being related to the subsequently practiced anisotropic etch operations. Though substantially horizontal disposition of the recess bottom regions 11 is preferred, the planarity is somewhat less critical than the sidewalls 8 and 9.

Figure 2:
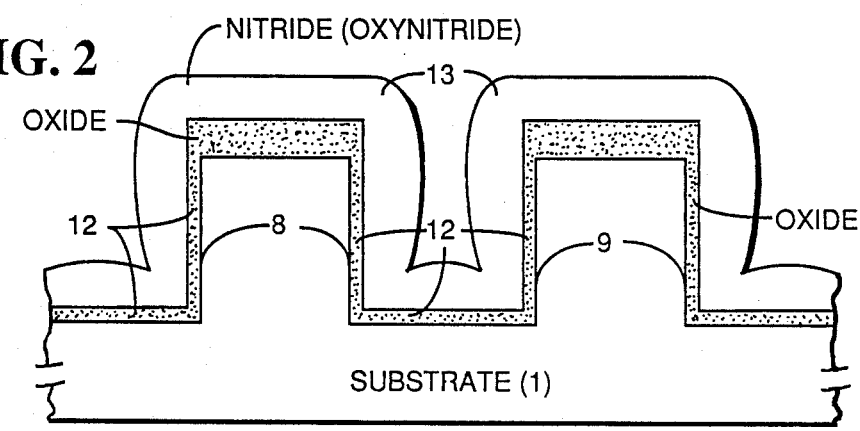

Following the strip of patterned photoresist 3, substrate 1 is preferably oxidized to form a thin thermal oxide layer 12 to a nominal thickness of 10–50 nanometers (FIG. 2). It is also feasible to form layer 12 by conformal chemical vapor deposition of oxide, or oxynitride, to the same thickness range. Oxide layer 12 serves as a pad or buffer between monocrystalline silicon substrate 1 and the succeedingly deposited nitride layer 13, in keeping with the recognized practice of isolating masking nitride layers from the substrate silicon to avoid dislocation damage attributable to the differences in thermal coefficient of expansion between, e.g., substrate 1 and nitride layer 13. Thereafter, nitride layer 13 is chemical vapor deposited to a nominal thickness of 500–1000 nanometers and under conditions which ensure a relatively conformal formation of the layer with reference to substantially vertical sidewalls 8 and 9. Layer 14 could be composed of silicon nitride rich oxynitride in place of pure silicon nitride.

Figure 3:
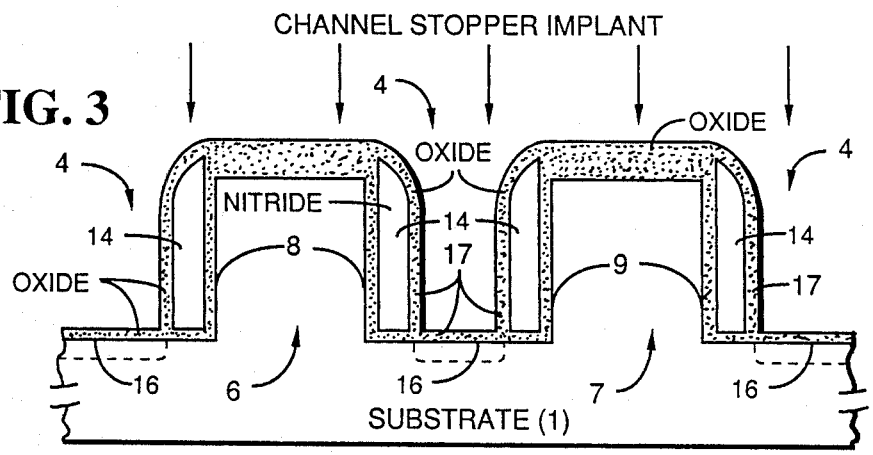

In progressing to the cross section depicted in FIG. 3, the structure shown in FIG. 2 is first subjected to anisotropic etch, for example, an RIE operation, to retain a nitride sidewall residual 14 over vertical sidewalls 8 and 9 of respective substrate 1 pedestal regions 6 and 7. The anisotropic etch of nitride layer 13 removes the nitride from all horizontally disposed regions, and specifically from the horizontally disposed regions over pedestals 6 and 7, and bottoms of the recesses 4. Preferably, the anisotropic etch is concluded following the removal of buffer oxide layer 12 at the bottom center region of each recess, so as to expose substrate surface regions 16 between sidewall nitrides 14. Another, relatively thin oxide layer 17 is then conformally formed over the structure, including substrate surface regions 16 and sidewall nitride layers 14, to create the structure depicted in FIG. 3. Preferably, the oxide is chemical vapor deposited to a nominal thickness of 10–50 nanometers.

A channel stopper implant using, for example, iodine ions may there be practiced on the structure in FIG. 3 to introduce an appropriate impurity gradient for the subsequently formed epitaxial region. The presence of thin oxide layer 17 over substrate surface 16 avoids implant damage to substrate surface 16.

Figure 4:
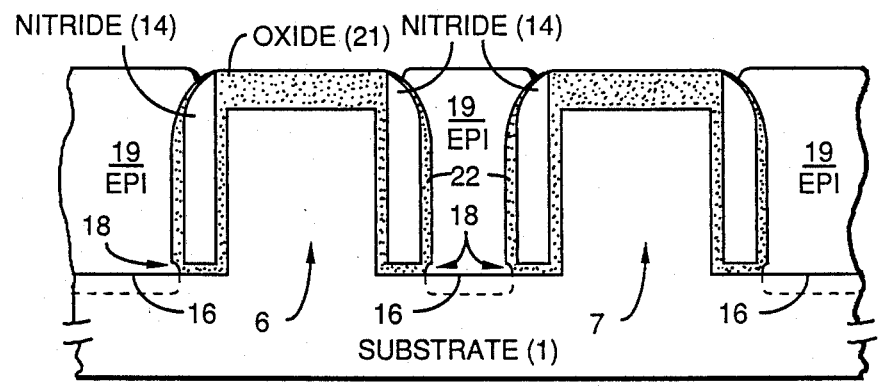

The structure depicted in FIG. 3 is then preferably subjected to an anisotropic etch, for example, an RIE operation, to remove from horizontally disposed surfaces the last deposited oxide layer 17 while retaining such oxide layer along the vertical sidewalls, as depicted in FIG. 4. In preparing surface 16 of substrate 1 for selective epitaxial growth of silicon, the monocrystalline silicon surface should be preclean with an $H_2$ or $H_2$ plus HCl. During such oxide etching preclean, sidewall nitride layers 14 operate as undercutting stoppers in corner regions such as 18. The nitride limits the extent of any undercut by the oxide preclean etchant, which etchant characteristically removes oxide at accentuated rates in the corners 18. Voids caused by such undercutting are noted in the aforementioned article authored by Kasai et al. Such voids are notorious for causing contamination problems during fabrication.

Selective epitaxial growth of silicon follows, preferably being performed at reduced pressure, using a mixture of $SiH_2Cl_2$-$H_2$-HCl, and with in situ doping. Boron dopant is suitable to form p-type epi, while phosphorus is suitable to form n-type epi regions. Clearly, the concentration of the impurity can be adjusted during epitaxial growth to create an impuriy gradient in the epitaxial region. If desired, the channel stopper implant described hereinbefore can be omitted by substituting a thin in situ doped epitaxial layer grown before the onset of the epitaxial growth forming major regions 19. The selective epitaxial growth of silicon is continued until the epi regions 19 approach the level of oxide 21, as appears generally in FIG. 4.

The quality of the selectively grown epi 19 is accentuated in the context of the present invention by the use of oxides for caps 21 and on sidewall layers 22, in that oxides characteristically exhibit fewer nucleation sites for undesired silicon formation during selective epitaxial growth, when compared to nitride surfaces. The quality of the epi grown in region 19 is thereby improved.

The structure shown by cross section in Fig. 4 is next subjected to a planarization, preferably using an isotropic etch which removes silicon, oxide and nitride at substantially equal rates to a level approximately 100–300 nanometers below the original surface of oxide 21. To further accentuate the planarity of the concluding surface, it is contemplated that the etching of the various regions be preceded with the deposition of a spin-on planarizing polymer layer and the application of matching etch conditions. Thereby, surface asperities in the SEG regions are substantially eliminated.

Figure 5:
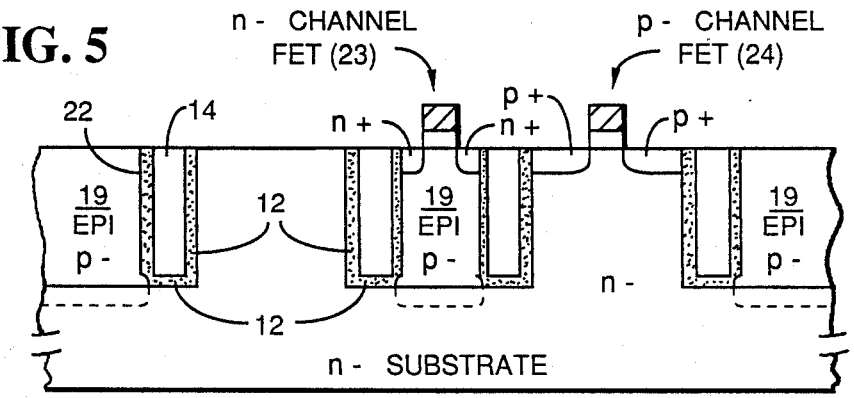
FIG. 5 is a cross section schematically illustrating the use of the concluding isolation structure to fabricate both n-channel and p-channel field effect transistors in adjacent epitaxial and substrate silicon regions.

A schematic representation of a concluding structure, which includes active field effect devices, is illustrated in FIG. 5. Note that the sidewall dielectric layers 12, 14 and 22 now form the elements of bird's beak free dielectric filled trench regions. In particular, note that the trench-like isolation regions are relatively narrow, yet relatively deep. The high dielectric constant of the nitride, or oxynitride, core 14 reduces the likelihood of inversion in adjacent regions, yet is isolated on all sides by an oxide pad/buffer layer to avoid stress damage in both the substrate silicon and the epitaxial silicon. The epitaxial regions can be doped in situ during formation to provide selected gradients of impurities. The formation of the trench-like isolation structures from a nitride layer which is relatively thick in relation to the thickness of the encasing pad oxide layer prevents the entrapment of voids. The presence of oxide surfaces for the trenchlike structure during selective epitaxial growth accentuates the quality of the epi region by minimizing spurious silicon nucleation sites. And finally, the concluding structure, prior to formation of active devices, is exceptionally planar due to the relative planarity at the commencement of planarization.

FIG. 5 shows the concluding structure of an n-type substrate and p-type epi region configured with exemplanary n-channel and p-channel field effect transistors, respectively at 23 and 24.

While the invention has been particularly shown and described with reference to a preferred embodiment, it should be understood by those of skill in the art that the various changes in form and detail may be made without departing from the scope and spirit of the invention as claimed.

I claim:

1. A process for forming trench-like isolation structures in a semiconductor substrate, comprising the steps of:
   forming recesses with substantially vertical sidewalls in selected regions of a semiconductor substrate;
   forming a relatively thin conformal buffer layer of first dielectric material over the semiconductor substrate;
   forming a relatively thicker and conformal isoloation dielectric layer of second dielectric material;
   selectively removing the second dielectric material to expose horizontally disposed substrate surfaces at the recess bottoms;
   following a selective removal of the second dielectric material, forming over the vertically disposed surfaces of the second dielectric material a relatively thin layer of third dielectric material; and
   selectively growing onto exposed substrate an epitaxial semiconductor region.

2. The process recited in claim 1, wherein the first and third dielectric materials are of substantially the same composition and the semiconductor substrate is monocrystalline silicon.

3. The process recited in claim 1, wherein the second dielectric material is silicon nitride or silicon nitride rich oxynitride and the third dielectric material is characterized by the substantial absence of nucleation sites for epitaxial semiconductor growth.

4. The process recited in claim 2, wherein the first and third dielectric materials are of silicon dioxide or oxynitride composition, and the formation of the relatively thin layer of third dielectric material comprises the individual steps of:
   conformally forming a relatively thin layer of third dielectric material; and
   preferentially removing by anisotropic etch the third dielectric layer material from exposed horizontally disposed surfaces.

5. The process recited in claim 4, wherein the second dielectric material is silicon nitride or silicon nitride rich oxynitride and the semiconductor substrate is monocrystalline silicon.

6. The process recited in claim 2, including the further step of planarizing the substrate and epitaxial regions using a nonpreferential etch to concurrently remove substrate, epitaxial and dielectric materials.

7. The process recited in claim 3, including the further step of planarizing the substrate and epitaxial regions using a nonpreferential etch to concurrently remove substrate, epitaxial and dielectric materials.

8. The process recited in claim 5, wherein the semiconductor substrate is doped by an impurity of a first type and the epitaxial semiconductor region is doped by an impurity of a second type.

9. The process recited in claim 8, wherein the step of forming recesses with substantially vertical sidewalls comprises the individual steps of:
   forming a relatively thick layer of silicon dioxide on the semiconductor substrate surface; and
   anisotropically etching of the silicon dioxide and semiconductor substrate in the presence of a selectively patterned photoresist mask.

10. A process for forming trench-like isolation structures in a silicon substrate, comprising the steps of:
    forming recesses with substantially vertical sidewalls in a silicon substrate covered by a silicon dioxide composition layer;
    forming a relatively thin conformal buffer first of silicon dioxide composition;
    forming a relatively thicker conformal layer of silicon nitride composition;
    anisotropically etching the structure to remove the silicon nitride and first silicon dioxide layers from the horizontally disposed bottom regions of the recesses in the substrate;
    following the anisotropic etch, forming over the substantially vertically disposrd surfaces of the silicon nitride layer, a relatively thin second layer of silicon dioxide composition, the silicon dioxide being characterized by a substantial absence of nucleation sites for epitaxial silicon growth;
    selectively growing onto the exposed silicon horizontally disposed in the bottom regions of the recesses a region of epitaxial silicon; and
    planarizing the structure to the non-recessed level of the silicon stbstrate by non-preferentially etching silicon, silicon nitride and silicon dioxide.

11. The process recited in claim 10, wherein the formation of the second thin layer of silicon dioxide comprises the individual steps of:
    conformally forming a second thin layer of silicon dioxide; and
    anisotropically etching the exposed second thin layer from the horizontally disposed surfaces in the bottom regions of the recesses.

12. The process recited in claim 11, wherein the silicon substrate is doped by an impurity of a first type and epitaxial silicon regions are doped by an impurity of a second type.

* * * * *